(12) United States Patent
Schmid

(10) Patent No.: US 6,998,346 B2
(45) Date of Patent: Feb. 14, 2006

(54) METHOD FOR THE PATTERNED, SELECTIVE METALLIZATION OF A SURFACE OF A SUBSTRATE

(75) Inventor: Günter Schmid, Hemhofen (DE)

(73) Assignee: Infineon Technologies, AG, Munich (DE)

( * ) Notice: Subject to any disclaimer, the term of this patent is extended or adjusted under 35 U.S.C. 154(b) by 113 days.

(21) Appl. No.: 10/675,634

(22) Filed: Sep. 30, 2003

(65) Prior Publication Data

US 2004/0103960 A1    Jun. 3, 2004

(30) Foreign Application Priority Data

Sep. 30, 2002  (DE)  ................. 102 45 928

(51) Int. Cl.
*H01L 21/44* (2006.01)
(52) U.S. Cl. ............ 438/676; 438/584; 438/612; 438/674; 438/677; 438/678; 438/680; 438/FOR 347
(58) Field of Classification Search ........ 438/676–678, 438/761, 763, 584, 612, 674, 680–681, FOR 347
See application file for complete search history.

(56) References Cited

U.S. PATENT DOCUMENTS

| | | | | |
|---|---|---|---|---|
| 4,385,388 A | * | 5/1983 | Engelking | .............. 372/32 |
| 4,859,496 A | * | 8/1989 | Toyonaga et al. | ........... 427/584 |
| 2001/0023052 A1 | * | 9/2001 | Koide | ............. 430/397 |

FOREIGN PATENT DOCUMENTS

| EP | 0 182 193 A2 | 5/1986 |
|---|---|---|
| EP | 0 260 516 A1 | 3/1988 |

* cited by examiner

*Primary Examiner*—George Fourson
*Assistant Examiner*—Thanh V. Pham
(74) *Attorney, Agent, or Firm*—Edell, Shapiro & Finnan, LLC

(57) ABSTRACT

The present invention provides a method for the patterned metallization of a surface of a substrate, comprising the steps of preheating the substrate to a temperature which is below a deposition temperature of a predetermined metal dissolved in a fluid provided above the surface, and performing patterned deposition of the predetermined metal in predetermined regions on the surface of the substrate by locally increasing the temperature to above the deposition temperature.

22 Claims, 1 Drawing Sheet

METHOD FOR THE PATTERNED, SELECTIVE METALLIZATION OF A SURFACE OF A SUBSTRATE

BACKGROUND OF THE INVENTION

1. Field of the Invention

The present invention relates to a method for the patterned, selective metallization of a surface of a substrate.

2. Discussion of Related Art

German patent DE 100 15 213 relates to a process for metalizing at least one insulating layer of a component, in which likewise a plurality of planes are uncovered for metallization by patterning and forming connections between a plurality of insulating layers. Moreover, German patent DE 100 15 214 relates to a process for metalizing an insulator and/or a dielectric in which first of all the insulator is activated, then it is coated with a further insulator and the latter insulator is patterned, after which the first insulator is seeded and finally metallized.

Solution baths for electroless metallization preferably in aqueous solution are known, but they do have drawbacks. Firstly, the substrate has to be activated, i.e. partially etched, before a seeding layer, e.g. comprising palladium, can be applied, then allowing electroless deposition of a metallization. A separate process step is required to enable the seed layer to be patterned. Furthermore, the deposition rate drops as the layer thickness of the metallization increases, which means that the layer thicknesses which can be achieved are limited for economic reasons (time consumption). In addition, the chemistry of the baths is highly complex and requires constant, complex analysis to ensure that the processes in the solution baths are taking place as intended. Alternatively, the solution baths can be frequently changed or replaced, in which case environmental problems arise on account of the heavy metal content of the solutions. Moreover, four solutions are typically required, which entails a high level of outlay. The four baths can be divided into an etching bath, a seeding bath, a reduction bath and a final metallization bath. Finally, when changing a bath, to prevent the solutions from contaminating one another, the device which has been treated in the bath has to be rinsed, and this also reduces efficiency.

An article by J. M. Blackburn, D. P. Long, A. Cabanas, J. J. Watkins, Science 294 (2001) 141 relates to a process in which metal films which cover the entire surface can be generated from organometal precursors (for copper: bishexafluoroacetylacetonate-copper (II) and tetramethylheptanedionate-copper (II); for nickel: biscyclopentadienyl-nickel (II) in aprotic solvents, such as for example liquid carbon dioxide (CCM, by reduction with hydrogen. In this case, the solution was heated to above a critical temperature in order to initiate deposition of metal. Patterned films were generated by prior seeding, as described above.

Therefore, the latter process also has the drawback that seeding is required in order to allow patterned deposition of metal. This entails considerable outlay, both in terms of technology and in terms of time and the associated costs.

SUMMARY OF THE INVENTION

Therefore, it is an object of the present invention to provide a process for the patterned, selective metallization of a substrate without prior seeding having to be carried out.

According to the invention, this object is achieved by the process for the patterned, selective metallization of a substrate in accordance with the present invention.

The idea on which the present invention is based substantially includes using an organometal compound for electroless metallization, which can be thermally activated selectively by means of a laser beam or by exposure via a mask. Process steps including deposition of a starting metallization, and thickening of the starting metallization can be carried out with a single metallization solution using a predetermined temperature profile.

In the present invention, the problems referred to in the introduction are solved in particular by virtue of the fact that a substrate is preheated, preferably in a suitable chamber, to below the deposition temperature of the dissolved metal, and the deposition process is initiated locally as a result of energy, e.g. from photons, being converted into thermal energy and the temperature at the surface of the substrate being locally increased to above the deposition temperature of the metallization which is to be provided. This results in selective deposition of metal in predetermined regions from a fluid provided above the surface of the substrate.

According to one embodiment, the temperature at the surface of the substrate is locally increased to above the deposition temperature selective provision of photons in the predetermined regions.

According to another embodiment, the photons are generated by a laser device.

According to another embodiment, the laser device guides a laser beam selectively over predetermined regions on the surface of the substrate.

According to another embodiment, following the photon-based deposition of a starting metallization in the predetermined regions on the surface of the substrate, the temperature of the substrate is increased until the deposition of the predetermined metal takes place autocatalytically up to a predetermined metallization thickness.

According to another embodiment, the photons are generated by a device for generating light pulses.

According to another embodiment, to locally increase the temperature by means of the light pulses, a mask is projected onto the surface of the substrate.

According to another embodiment, the mask has a reflective surface, for example made from chromium.

According to another embodiment, the method may further include performing the patterned deposition of metal in at least one of the locally heated and predetermined regions on the surface of the substrate autocatalytically up to a desired metallization thickness.

According to another embodiment, the preheating of the substrate is set to a temperature just below the deposition temperature of the dissolved metal. In this context, the expression "dissolved metal" preferably defines a solution of an organometal complex or salt, if appropriate with reducing additives, which is able to deposit metal.

According to another embodiment, the metal for the patterned metallization is fed by means of a liquid solution of an organometal compound.

According to another embodiment, the organometal compound is dissolved in an aprotic solvent, such as for example, carbon dioxide ($CO_2$), hydrocarbons, paraffins, aromatics or ethers.

According to another embodiment, the substrate which is to be provided with the patterned metallization includes an inorganic substrate, in particular silicon dioxide ($SiO_2$) or silicon nitride (SiN).

According to another embodiment, the substrate which is to be provided with the patterned metallization includes an organic substrate, in particular polyimide or polybenzoxazoles.

According to another embodiment, the method is carried out in a process chamber with a covering device, preferably made from quartz glass, which is transparent to the corresponding photons.

According to another embodiment, the substrate is positioned, for example, as part of a wafer, on a holder whose temperature can be controlled.

According to another embodiment, the temperature of the process chemicals which are to be supplied, such as for example a metal solution, is also controlled.

According to another embodiment, the patterned metallization on the surface of the substrate forms a rewiring device on a preferably passivated semiconductor substrate.

BRIEF DESCRIPTION OF THE DRAWINGS

Preferred embodiments of the invention can be understood in more detail from the following descriptions below taken in conjunction with the accompanying drawings, in which.

DETAILED DESCRIPTION OF THE PREFERRED EMBODIMENTS

Preferred embodiments of the present invention will now be described more fully hereinafter below in more detail with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, identical reference symbols in each case refer to identical or functionally equivalent components.

The patterned metallization of a substrate or its surface is described below with reference to metallized rewiring devices on a semiconductor device, although the process can in principle be expanded to cover all kinds of possible applications. For example, during flip-chip mounting of semiconductor chips on printed circuit boards, edge contacts on a semiconductor device which have a very small pitch between them have to be rewired onto the entire chip surface in order to be embedded in a housing. To increase the efficiency of the production process, this is preferably done by processing an entire wafer, i.e. the contact devices of a plurality of chips are rewired simultaneously.

Figure 1:
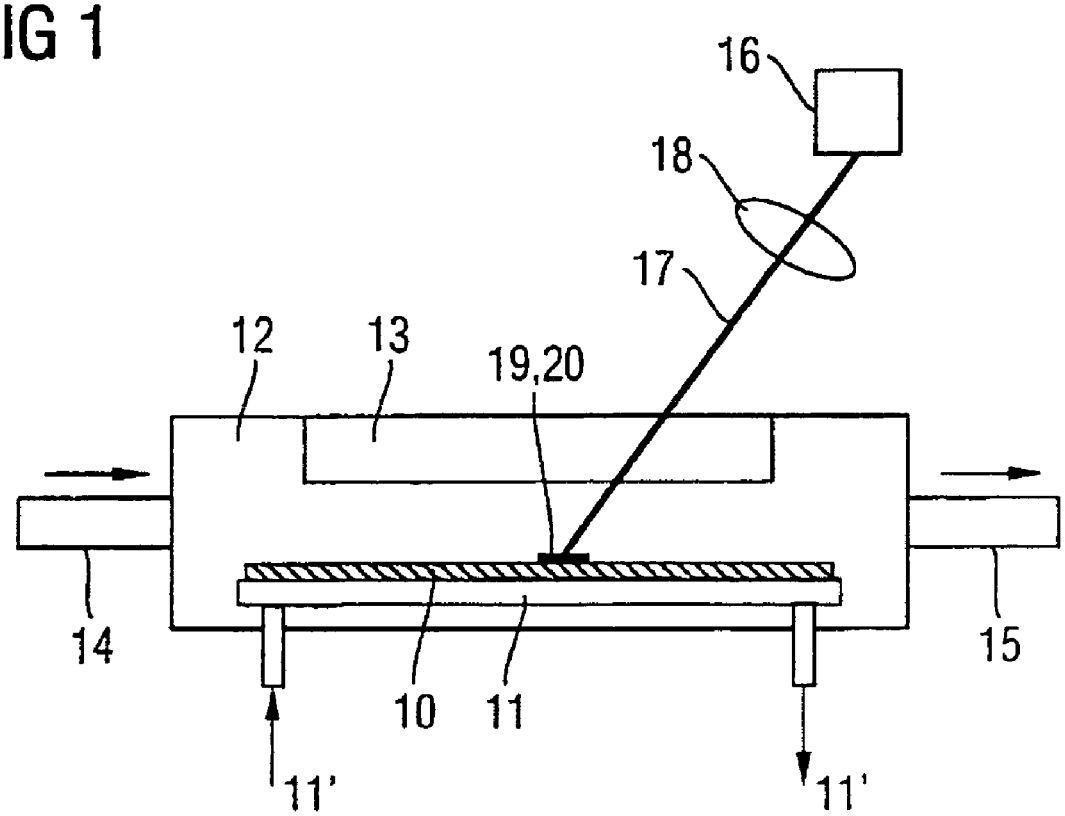
FIG. 1 shows a diagrammatic side view of a substrate which is to be metallized for the purpose of explaining one embodiment of the present invention.

FIG. 1 shows a diagrammatic side view of a substrate which is to be metallized according to one embodiment of the present invention.

FIG. 1 illustrates a substrate 10, which preferably forms a semiconductor substrate in wafer form. The substrate 10 is seated on a holder 11 whose temperature can be controlled and can be set, for example, to a desired temperature by means of a stream of liquid 11'. The substrate 10 is arranged inside a process chamber 12, which preferably has a transparent window 13 or a light-transmitting covering above the substrate 10. Process chemicals, preferably temperature-controlled process chemicals, such as for example an aprotic solvent with a metal precursor, such as for example organometallic copper or nickel compounds dissolved therein, can be introduced into the process chamber 12 via a feed 14 and released again from the process chamber 12 via an outlet 15.

By way of example, photons, i.e. energy, can penetrate into the process chamber 12 via the transparent process chamber window 13, which preferably consists of quartz glass. To generate photons, i.e. light energy, it is on the one hand possible to use a laser device 16, which guides a laser beam 17 which can be controlled in a targeted manner, for example, by means of lens optics 18, to predetermined regions 19, 20 on the surface of the substrate 10. Predetermined regions 19, 20 of this type include, for example, a rewiring interconnect 19 and/or a rewiring contact pad 20. The photon energy of the light particles in the laser beam 17 locally raises the temperature at the predetermined regions 19, 20 on the surface of the substrate 10 to above the deposition temperature of the metal dissolved in a fluid, in the preferably aprotic solvent, by means of the controlled laser beam. After deposition of a starting metallization has been completed in the predetermined regions 19, 20, the temperature of the substrate can be increased until the deposition of metal continues autocatalytically up to the desired metallization thickness. However, to achieve a homogeneous layer thickness, the temperature of the chamber is kept below the deposition temperature until formation of the starting metallization layer is complete, even when there is already an existing layer of metal in the regions 19, 20 on the surface of the substrate 10.

The starting metallization is deposited at a temperature T1. This starting metallization defines the patterning induced by the supply of photon energy. After the starting metallization has been completed, the temperature is increased to T2, at which the deposition of metal takes place only in the regions where a starting metallization is present, i.e. the metal layers are homogenously thickened. At a still higher temperature T3, metal deposition takes place independently of the substrate. T2 must be below T3.

On the other hand, the local increase in temperature in the predetermined regions 19, 20 on the surface of the substrate 10 can be generated by a, preferably high-energy, light pulse which is partially reflected by a mask (not shown) on the surface of the substrate 10. A patterned mask which is suitable for such an application has a reflective surface, for example comprising chromium. The mask covers all surface sections of the substrate 10 which are not to be provided with a metallization by the exposure or local heating process.

In this context, it is advantageous for it to be possible to set the temperature of the substrate 10 and/or of the process chemicals to a level just below the deposition temperature. The further deposition of metal can then take place autocatalytically up to the desired metallization thickness at the locations which were initially exposed. As an alternative to a laser device 16 or a flash of light via a suitable projection arrangement having a light source and a mask, the local, patterned, i.e. selective, heating can also be effected, for example, by means of a high-energy stepper, in which case the patterning can be ensured by means of cross-hair optics or a reticle.

In principle, any desired substrate surface 10 can be selected, but the photon pulse should be absorbed to a sufficient extent for local heating to occur. Inorganic substrates, such as for example silicon dioxide ($SiO_2$) and silicon nitride (SiN), whose absorption characteristics can be controlled by means of their layer thickness are just as suitable as organic substrates, such as for example polyimide or polybenzoxazoles, which are generally already present as a buffer or passivation layer on a chip or wafer and absorb light particularly well below a wavelength of 400 nm.

An additional advantage of the method according to the invention is the fact that contact-making devices 21 which were originally provided on the substrate, i.e. were present prior to the application of the rewiring device 19, 20, such as for example aluminum pads, do not have to be protected from an aqueous environment or surface-treated for metal to be deposited, for example using an expensive zincate process. The use of an aprotic solvent provides sufficient protection in this respect.

Particularly in the application area of providing a rewiring device 19, 20 on a substrate 10, the demands imposed on the resolution are not especially high (>20 μm). Accordingly, to deposit a metallization it is possible for the aprotic solvent used, rather than being liquid $CO_2$, also to be other aprotic solvents, such as for example hydrocarbons (hexane, heptane, octane), paraffins, aromatics (benzene, toluene, xylene, mesitylene, cumene), ethers (anisole, diphenyl ether, dibutyl ether, diethyleneglycol diethyl ether), or other high-boiling representatives of this class. In addition to hydrogen, the reducing agent used may also be formaldehyde.

Figure 2:
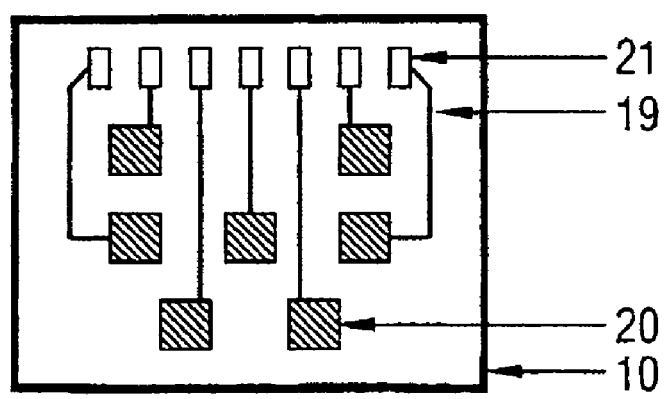
FIG. 2 shows a diagrammatic plan view of a semiconductor device with rewiring metallization provided.

FIG. 2 illustrates a diagrammatic plan view of a semiconductor device which has contact-making devices 21 or pads on a substrate 10 wherein each lead via rewiring devices 19 is distributed to larger contact-making devices 20. FIG. 2 illustrates a single chip which provides a cut or sawn edge along which the individual chip has been separated from a wafer.

Alternatives to the stipulation of specific solvents or metals or substrates can be considered. For example, as an alternative to depositing copper as metallization above the predetermined regions, it is also possible, for example, to use nickel. Furthermore, the reduction can be carried out not only in $CO_2$ but also, for example, in mesitylene.

Furthermore, the local temperature increase in or above the predetermined regions can also be effected in other ways than with photons, for example by using electron beams, gamma rays or ion beams.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for patterned metallization of a surface of a substrate, comprising:
preheating the substrate to a temperature which is below a deposition temperature of a predetermined metal dissolved in a fluid provided above the surface of the substrate;
performing patterned deposition of the predetermined metal in predetermined regions on the surface of the substrate as a starting metallization by locally increasing the temperature at the surface of the substrate to a temperature above the deposition temperature; and
increasing the temperature of the substrate to a second temperature until deposition of the predetermined metal takes place autocatalytically at the starting metallization for forming a metallization having a predetermined metallization thickness, wherein the second temperature is below the deposition temperature.

2. The method according to claim 1, wherein the temperature at the surface of the substrate is locally increased to above the deposition temperature by selectively providing photons in the predetermined regions.

3. The method according to claim 2, wherein the photons are generated by a laser device.

4. The method according to claim 3, wherein the laser device guides a laser beam selectively over a surface of the predetermined regions on the substrate.

5. The method according to claim 2, wherein the photons are generated by a device for generating light pulses.

6. The method according to claim 5, wherein a mask is applied to the surface of the substrate before the temperature is locally increased by the light pulses.

7. The method according to claim 6, wherein the mask has a reflective surface.

8. The method according to claim 7, wherein the reflective surface includes chromium.

9. The method according to claim 1, further comprising: performing patterned deposition of the predetermined metal in at least one of a locally heated region and the predetermined region autocatalytically up to a predetermined metallization thickness.

10. The method according to claim 1, wherein the predetermined metal is fed to the substrate by a liquid solution of an organometal compound.

11. The method according to claim 10, wherein the organometal compound is dissolved in an aprotic solvent.

12. The method according to claim 11, wherein the aprotic solvent includes one of carbon dioxide (CO.sub.2), a hydrocarbon, a paraffin, an aromatic and an ether.

13. The method according to claim 1, wherein the substrate includes one of silicon dioxide (SiO.sub.2) or silicon nitride (SiN).

14. The method according to claim 1, wherein the substrate includes one of a polyimide and polybenzoxazoles.

15. The method according to claim 1, wherein the method is performed in a process chamber having a covering device.

16. The method according to claim 15, wherein the covering device is made from quartz glass.

17. The method according to claim 15, wherein the covering device is transparent to photons.

18. The method according to claim 1, wherein the substrate is positioned on a holder and a temperature of the holder is capable of being controlled.

19. The method according to claim 1, further comprising: controlling the temperature of supplied process chemicals.

20. The method according to claim 19, wherein one of the supplied process chemicals includes a solution in which the predetermined metal is dissolved.

21. The method according to claim 1, wherein the patterned metallization forms a rewiring device on the surface of the substrate.

22. The method according to claim 21, wherein the substrate is a passivated semiconductor substrate.

* * * * *